United States Patent
Adams et al.

(10) Patent No.: US 8,160,113 B2
(45) Date of Patent: Apr. 17, 2012

(54) TAILORED PULSE BURST

(75) Inventors: Frank J. Adams, Los Altos, CA (US); Manuel J. Leonardo, San Francisco, CA (US); David L. Klein, Palo Alto, CA (US)

(73) Assignee: Mobius Photonics, Inc., Mountain View, CA (US)

( * ) Notice: Subject to any disclaimer, the term of this patent is extended or adjusted under 35 U.S.C. 154(b) by 431 days.

(21) Appl. No.: 12/506,849

(22) Filed: Jul. 21, 2009

(65) Prior Publication Data

US 2011/0019705 A1 Jan. 27, 2011

(51) Int. Cl.
*H01S 3/10* (2006.01)

(52) U.S. Cl. .. 372/25; 372/26; 372/29.015; 372/29.011; 372/29.01

(58) Field of Classification Search ............ 372/25, 372/26, 29.015, 29.011, 29.01
See application file for complete search history.

(56) References Cited

U.S. PATENT DOCUMENTS

| 7,529,281 B2 | 5/2009 | Leonardo et al. |
| 2008/0013163 A1* | 1/2008 | Leonardo et al. ........ 359/341.31 |
| 2008/0198445 A1* | 8/2008 | Murison et al. .......... 359/337.13 |
| 2008/0225904 A1* | 9/2008 | Brown et al. ................ 372/22 |
| 2009/0185588 A1* | 7/2009 | Munroe .................... 372/22 |

OTHER PUBLICATIONS

International Search Report and Written Opinion dated Sep. 13, 2010 of the International Searching Authority issued for International patent application No. PCT/US10/42663.

* cited by examiner

*Primary Examiner* — Kinam Park
(74) *Attorney, Agent, or Firm* — Joshua D. Isenberg; JDI Patent

(57) ABSTRACT

Output pulses from an optical system having a seed source and an optical amplifier coupled to the seed source may be controlled by controlling a power of a seed signal from the seed source. The seed signal may be varied between a minimum value and a maximum value in a way that the seed signal exhibits one or more pulse bursts. Each pulse burst may contain one or more pulses. During an inter-pulse period between successive pulses within a pulse burst or between successive pulse bursts, the power of the seed signal may be adjusted to an intermediate value that is greater than the minimum value and less than the maximum value. The intermediate value is chosen to control a gain in the optical amplifier such that a pulse or pulse burst that follows the period exhibits a desired behavior.

23 Claims, 6 Drawing Sheets

TAILORED PULSE BURST

FIELD OF THE INVENTION

Embodiments of this invention generally relate to lasers and optical amplifiers and more particularly to wavelength converted optical systems with high peak powers and pulse energies suitable for material processing applications.

BACKGROUND OF THE INVENTION

Current diode-pumped, solid-state (DPSS) lasers only run stably over a narrow range of operating parameters. Even within the specified range, parameters such as beam pointing and beam size may vary. Current laser applications generally benefit from a flat-topped pulse burst of pulses of coherent light. By flat-topped, it is meant that the pulses are of a relatively consistent pulse height within a group of pulses. Such a flat-topped pulse burst is typically generated through use of a fast external modulator, such as an acousto-optic modulator or an internal Q-Switch, which is required if the laser cavity is unstable or is not operating in a continuous fashion. However, external modulators and internal Q-switches are both cumbersome and expensive to implement.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
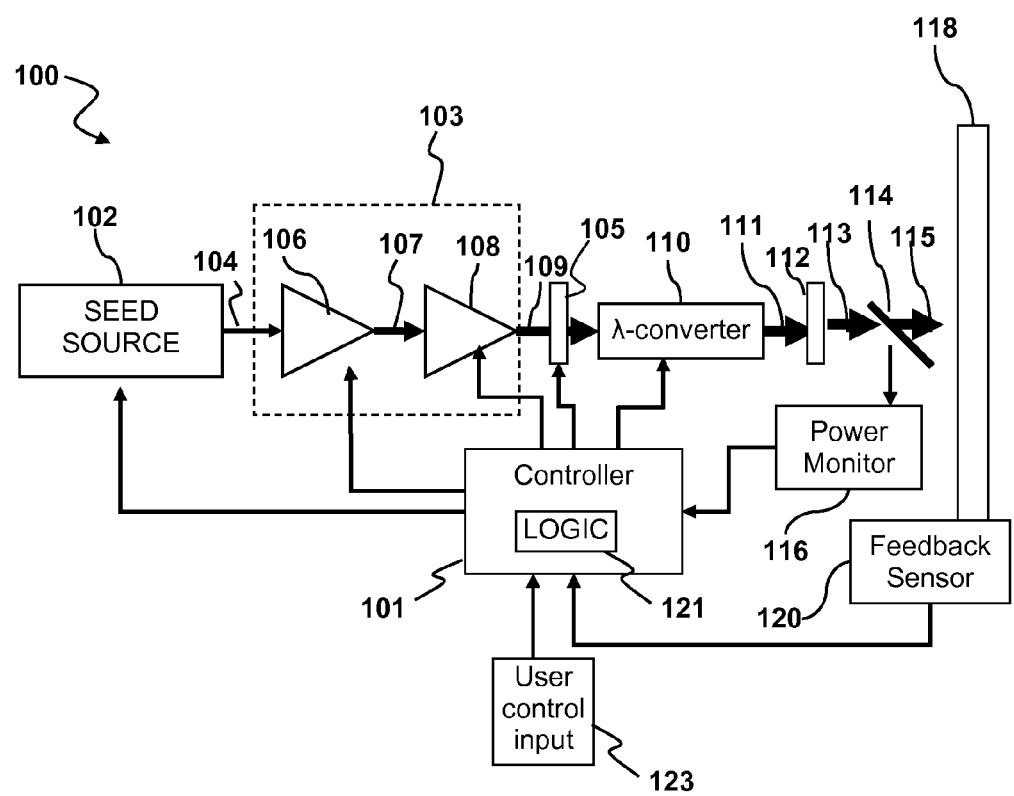
FIG. 1 is a schematic diagram of an optical system according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Glossary:

As used herein:

Beam splitter refers to an optical device capable of splitting a beam of light into two or more parts.

Brillouin scattering refers to a nonlinear optical phenomenon involving spontaneous scattering of light in a medium due to interaction between the light and sound waves passing through the medium.

Cavity or Optically Resonant Cavity refers to an optical path defined by two or more reflecting surfaces along which light can reciprocate or circulate. Objects that intersect the optical path are said to be within the cavity.

Chirping refers to a rapid change as opposed to a long-term drift in the emission wavelength of an optical source.

Continuous wave (CW) laser refers to a laser that emits radiation continuously rather than in short bursts, as in a pulsed laser.

Duty Cycle (D) refers to the product of the pulse duration $\tau$ and the pulse repetition frequency (PRF) for pulses that occur at regular intervals. The duty cycle may be expressed as a ratio, for example, 0.01 or equivalently may be expressed as a percentage, for example 1%.

Diode Laser refers to a light-emitting diode designed to use stimulated emission to generate a coherent light output. Diode lasers are also known as laser diodes or semiconductor lasers.

Diode-Pumped Laser refers to a laser having a gain medium that is pumped by a diode laser.

Gain refers to an increase in intensity, power, or pulse energy of a signal that is transmitted from one point to another through an amplifier. The term "unsaturated gain" refers to the increase of a small signal passing through the amplifier, which does not significantly change the inversion level in the amplifier. As used herein gain and unsaturated gain will be used interchangeably.

Gain Medium refers to a material capable of generating optical gain as described below with respect to a Laser.

Garnet refers to a particular class of oxide crystals, including e.g., yttrium aluminum garnet (YAG), gadolinium gallium garnet (GGG), gadolinium scandium gallium garnet (GSGG), yttrium scandium gallium garnet (YSGG) and similar.

Infrared Radiation refers to electromagnetic radiation characterized by a vacuum wavelength between about 700 nanometers (nm) and about 100,000 nm.

Laser is an acronym of light amplification by stimulated emission of radiation. A laser is a cavity that is contains a lasable material. This is any material—crystal, glass, liquid, semiconductor, dye or gas—the atoms of which are capable of being excited to a metastable state by pumping e.g., by light or an electric discharge. Light is emitted from the metastable state by the material as it drops back to the ground state. The light emission is stimulated by the presence by a passing photon, which causes the emitted photon to have the same phase and direction as the stimulating photon. The light (referred to herein as stimulated radiation) oscillates within the cavity, with a fraction ejected from the cavity to form an output beam.

Light: As used herein, the term "light" generally refers to electromagnetic radiation in a range of frequencies running from infrared through the ultraviolet, roughly corresponding to a range of vacuum wavelengths from about 1 nanometer ($10^{-9}$ meters) to about 100 microns.

Mode-Locked Laser refers to a laser that functions by controlling the relative phase (sometimes through modulation with respect to time) of each mode internally to give rise selectively to energy bursts of high peak power and short duration, e.g., in the picosecond ($10^{-12}$ second) domain.

Non-linear effect refers to a class of optical phenomena that can typically be viewed only with nearly monochromatic, directional beams of light, such as those produced by a laser. Higher harmonic generation (e.g., second-, third-, and fourth-harmonic generation), optical parametric oscillation, sum-frequency generation, difference-frequency generation, optical parametric amplification, and the stimulated Raman Effect are examples of non-linear effects.

Nonlinear Optical Wavelength Conversion Processes are non-linear optical processes whereby input light of a given vacuum wavelength $\lambda_0$ passing through a non-linear medium interacts with the medium and/or other light passing through the medium in a way that produces output light having a different vacuum wavelength than the input light. Nonlinear wavelength conversion is equivalent to nonlinear frequency conversion, since the two values are related by the vacuum speed of light. Both terms may be used interchangeably. Nonlinear Optical Wavelength conversion includes:

Higher Harmonic Generation (HHG), e.g., second harmonic generation (SHG), third harmonic generation (THG), fourth harmonic generation (FHG), etc., wherein two or more photons of input light interact in a way that produces an output light photon having a frequency $Nf_0$, where N is the number of photons that interact. For example, in SHG, N=2.

Sum Frequency Generation (SFG), wherein an input light photon of frequency $f_1$ interacts with another input light photon of frequency $f_2$ in a way that produces an output light photon having a frequency $f_1+f_2$.

Difference Frequency Generation (DFG), wherein an input light photon of frequency $f_1$ interacts with another input light photon of frequency $f_2$ in a way that produces an output light photon having a frequency $f_1-f_2$.

Non-linear material refers to materials that possess a non-zero nonlinear dielectric response to optical radiation that can give rise to non-linear effects. Examples of non-linear materials include crystals of lithium niobate ($LiNbO_3$), lithium triborate (LBO), beta-barium borate (BBO), Cesium Lithium Borate (CLBO), KDP and its isomorphs, $LiIO_3$, as well as quasi-phase-matched materials, e.g., PPLN, PPSLT, PPKTP and the like. Optical fiber can also be induced to have a non-linear response to optical radiation by fabricating microstructures in the fiber.

Optical amplifier refers to an apparatus that amplifies the power of an input optical signal. An optical amplifier is similar to a laser in that it uses a gain medium driven by pumping radiation. The amplifier generally lacks feedback (i.e. a cavity), so that it has gain but does not oscillate. As used herein an optical power amplifier generally refers to the last optical amplifier before delivery of an amplified beam to a target or a wavelength converter. An amplifier stage between a source of radiation and a power amplifier is generally referred to herein as a preamplifier.

Phase-matching refers to the technique used in a multiwave nonlinear optical process to enhance the distance over which the coherent transfer of energy between the waves is possible. For example, a three-wave process is said to be phase-matched when $k_1+k_2=k_3$, where $k_i$ is the wave vector of the $i^{th}$ wave participating in the process. In frequency doubling, e.g., the process is most efficient when the fundamental and the second harmonic phase velocities are matched. Typically the phase-matching condition is achieved by careful selection of the optical wavelength, polarization state, and propagation direction in the non-linear material.

Pulse Duration ($\tau$) refers to the temporal duration or lifetime of a repetitive signal, e.g., the time interval between the half-power points on the leading and trailing edges of the pulse. Pulse duration is sometimes referred to as "pulse width".

Pulse Energy refers to the amount of energy in a pulse. Pulse energy may be calculated by integrating instantaneous pulse power over the pulse period.

Pulse Period (T) refers to the time between equivalent points of successive pulses in a train of two or more pulses.

Pulse Repetition Frequency (PRF) refers to the rate of repetition of pulses per unit time. The PRF is inversely related to the period T, e.g., PRF=1/T.

Q refers to the figure of merit of a resonator (cavity), defined as ($2\pi$)×(average energy stored in the resonator)/(energy dissipated per cycle). The higher the reflectivity of the surfaces of an optical resonator and the lower the absorption losses, the higher the Q and the less energy loss from the desired mode.

Q-switch refers to a device used to rapidly change the Q of an optical resonator.

Q-switched Laser refers to a laser that uses a Q-switch in the laser cavity to prevent lasing action until a high level of inversion (optical gain and energy storage) is achieved in the lasing medium. When the switch rapidly increases the Q of the cavity, e.g., with acousto-optic or electro-optic modulators or saturable absorbers, a giant pulse is generated.

Quasi-CW refers to generating a succession of pulses at a high enough repetition rate to appear continuous.

Quasi Phase-matched (QPM) Material: In a quasi-phase-matched material, the fundamental and higher harmonic radiation are phase-matched by periodically changing the sign of the material's non-linear coefficient. The period of the sign change ($k_{QPM}$) adds an additional term to the phase matching equation such that $k_{QPM}+k_1+k_2=k_3$. In a QPM material, the fundamental and higher harmonic can have identical polarizations, often improving efficiency. Examples of quasi-phase-matched materials include periodically-poled lithium tantalate (PPLT), periodically-poled lithium niobate (PPLN), periodically poled stoichiometric lithium tantalate (PPSLT), periodically poled potassium titanyl phosphate (PPKTP) or periodically poled microstructured glass fiber.

Raman Scattering refers to a scattering of incident light by matter in which the scattered light has a lower frequency than the incident light. The difference between the frequencies of the incident and scattered light (referred to as the Raman shift) corresponds to a natural vibrational frequency of the scattering material.

Saturation of an optical amplifier refers to a decrease of the gain coefficient of a medium near some transition frequency when the power of the incident radiation near that frequency exceeds a certain value. If the gain coefficient is constant, the power emitted by the medium is proportional to the incident power. However, there is typically a limit to the rate at which a gain medium can emit power. This limit depends on the lifetimes of the energy levels involved. As this limit is reached, the stimulated transitions become rapid enough to significantly lower the upper energy level population, thereby decreasing the gain coefficient. The effect is to "flatten" the amplified power as a function of input power.

Stimulated Brillouin Scattering refers to a type of amplification process in which intense light causes deformation of a crystal lattice that generates ultrasonic waves in the lattice.

Stimulated Raman Scattering (SRS) is a type of Raman scattering that can occur with an intense optical beam. The Raman-scattered light experiences gain and its power increases exponentially. If the power of the incident light exceeds a threshold value, a large portion of the incident light is converted to Raman-scattered light having a lower frequency than the incident light. SRS is also sometimes known as the stimulated Raman effect or coherent Raman effect.

Ultraviolet (UV) Radiation refers to electromagnetic radiation characterized by a vacuum wavelength shorter than that of the visible region, but longer than that of soft X-rays. Ultraviolet radiation may be subdivided into the following wavelength ranges: near UV, from about 380 nm to about 200 nm; far or vacuum UV (FUV or VUV), from about 200 nm to about 10 nm; and extreme UV (EUV or XUV), from about 1 nm to about 31 nm.

Vacuum Wavelength: The wavelength of electromagnetic radiation is generally a function of the medium in which the wave travels. The vacuum wavelength is the wavelength electromagnetic radiation of a given frequency would have if the radiation were propagating through a vacuum and is given by the speed of light in vacuum divided by the frequency.

Saturation Intensity ($I_{sat}$): The intensity which reduces the gain of an amplifier to half of its small-signal value. An amplifier is said to be saturated if the signal intensity passing through the amplifier is significantly larger than the saturation intensity.

Embodiments of the present invention take advantage of the Applicants' discovery that the output power and pulse characteristics of a seeded, fiber-amplified, optical system may be made independent of the pulse trigger history by means of controlling the inter-pulse seed emission. Here inter-pulse refers to either a period between successive pulses within a pulse burst or between successive pulse bursts. Normally this emission would be zero or some low value. However, the Applicants have discovered that by controlling the inter-pulse seed emission in a non-zero manner such that the emission has a suitable non-zero value, a constant or user defined unsaturated gain can exist in the power amplifier at the beginning of each pulse.

Based on this discovery, an optical system according to an embodiment of the present invention has been developed. The optical system allows control of individual pulses within a pulse burst where the pulse characteristics such as pulse energy, peak power, and pulse width can be controlled on each individual pulse. Furthermore, such control can be accomplished with a nominally constant pump power to the power amplifier. Such an optical system can provide an unprecedented level of control in material processing applications.

FIG. 1 depicts an optical system 100 according to an embodiment of the present invention. Specifically, the system 100 generally includes a controller 101, a seed source 102, one or more optional optical amplifiers 106, a power amplifier 108 and an optional wavelength converter 110. The seed source 102 generates an optical seed signal 104, which is optically coupled to the optional preamplifier 106. The seed signal 104 may be amplified by the pre-amplifier 106 to generate a pre-amplified signal 107 which is further amplified in the power amplifier 108 to produce an amplified output 109. The optical amplifier 108 may be pumped at a nominally constant pump rate. By way of example, the optical amplifier 108 may be a fiber amplifier. Examples of fiber amplifiers are described, e.g., in commonly-assigned U.S. Pat. No. 7,529,281, the entire contents of which are incorporated herein by reference in its entirety. In particular, FIG. 3 of U.S. Pat. No. 7,529,281 and the associated discussion describe an example of a fiber amplifier.

As is well known in the art, bandpass filters, optical switches, and optical isolators can be placed between the amplifier stages to prevent backward propagating beams and minimize the effects of unseeded spontaneous emission The amplified output 109 from the optical power amplifier 108 may be optically coupled to the optional wavelength converter 110. The wavelength converter 110 converts at least a portion of the amplified output 109 to produce a wavelength converted output 111 characterized by a different optical frequency than the amplified output 109. The wavelength converter 110 may implement a nonlinear optical wavelength conversion process. In some embodiments of the invention, the system 100 may include coupling optics 105 that receive the amplified output 109 from the optical amplifier 108 and transmit it to the wavelength converter 110. In some embodiments the wavelength converter 110 may not be required.

The system 100 may also include coupling optics 112 that receive the wavelength-converted output 111 and transmit a final output 113. The coupling optics 112 may include simple windows and may also include an optical fiber.

The controller 101 may be operably coupled to the seed source 102 and/or optional optical preamplifier 106, power amplifier 108, and/or wavelength converter 110. The controller 101 includes logic 121 adapted to control the power of the seed signal 104. The controller 101 may adjust the wavelength-converted average power and/or pulse energy of a remaining output 115 in response to user control inputs 123. Specifically, the logic 121 may be configured to control the power of the seed signal 104 as discussed below. In some embodiments, the system controller 101 may operate in response to one or more feedback signals. For example, from feedback sensor 120 may detect a response to the remaining output 115 on a target 118. Alternatively, a portion of the final output 113 may be deflected, e.g., by a beamsplitter 114 to a power monitor 116 and this signal may be used as part of a feedback loop. A further alternative may be using a feedback signal from the seed source 102 to controller 101 to stabilize and control seed source optical power 104. By way of example, and not by way of limitation, the feedback sensor 120 may measure a rate of movement of the target 118. The controller 101 may respond to changes in the rate of movement of the target 118 by adjusting the period between pulses within a given burst or the period between successive pulse bursts so that the output 115 strikes the target 118 at equally-spaced locations.

The remaining output 115 may be delivered to any of a number of different types of targets 118 to implement any of a number of different types of processes depending on the application. Applications include, but are not limited to, material processing, medical treatments, laser particle accelerators, and wafer inspection. Examples of suitable targets include, but are not limited to, metals, ceramics, semiconductors, polymers, composites, thin films, organic materials, in vitro or in vivo biological samples, and elementary particles. In the particular case of material processing, targets may include, e.g., wires, printed circuit (PC) boards, integrated circuit (IC) packages, IC wafers dies, LED wafers, packages, dies and the like. Examples of material processing applications include surface texturing, heat treatment, surface engraving, fine micro-machining, surface ablation, cutting, grooving, bump forming, coating, soldering, brazing, sintering, sealing, welding, link blowing, wafer scribing, dicing and marking, via drilling, memory repair, flat panel display repair, stereolithography, maskless lithography, surface diffusion and surface conversion to a compound.

The seed source 102 can be any of the representative laser types of semiconductor seed sources, such as distributed feedback laser (DFB), distributed Bragg reflector laser (DBR), Fabry-Perot laser (FP), external cavity diode laser, vertical cavity semiconductor laser (VCSEL), vertical extended cavity semiconductor laser (VECSEL), or amplified stimulated emission source (ASE). All of above sources may have output power rapidly modulated by modulating a driving current. Alternatively, the seed source 102 can be any of the above semiconductor seed sources integrated with other semiconductor components. For example a DFB laser may be integrated with a semiconductor amplifier and/or an electro-absorption modulator. The seed source 102 also can be other seed sources with a fast external modulator. For example, a fiber laser with a Mach Zehnder type electro-optic modulator. The seed source 102 can be a combination of current modulation and external modulation to generate desired seed output characteristics.

Pulsed operation of the system shown in FIG. 1 may be used in many applications because it allows power stored in a power amplifier 108 to be released in short pulses. A simplest type of pulsed operation is continuous pulse train with the power amplifier 108 being pumped at a constant pump rate. To first order, peak fundamental output power is increased by factor of 1/DC, where DC is the pulse duty cycle. Duty cycle may be in the range from 0.01 to 0.00001. Peak power in amplified output 109 is 100 to 100,000 times the output of power amplifier operating in a continuous wave (cw) condition.

Figure 2:
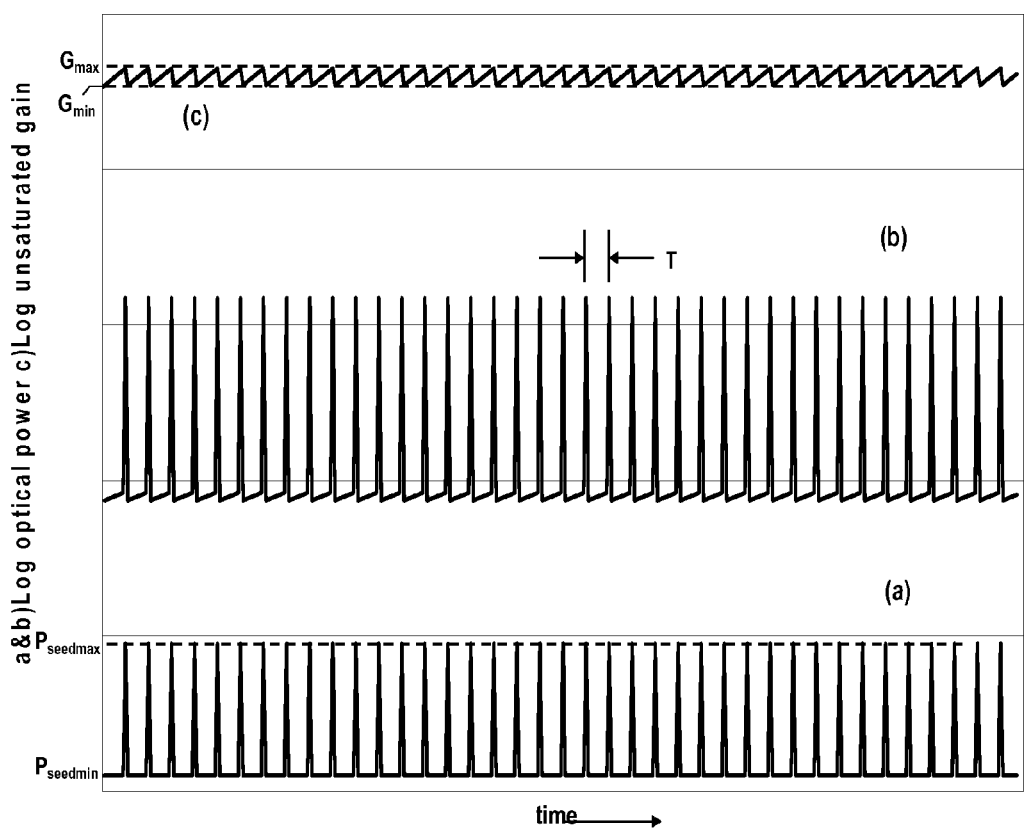
FIG. 2 is a timing diagram illustrating power amplifier temporal behavior in steady state pulsed conditions.

FIG. 2 illustrates an example of temporal behavior of a seeded pulsed power amplifier operating in steady state pulsed conditions. Curve (a) represents the logarithm of the power of the seed signal 104. In this case, seed source output power is modulated between a minimum value $P_{seedmin}$ and a maximum value $P_{seedmax}$. The pulse period is T and pulse repetition frequency is 1/T. Pulse repetition frequency may be in a broad range between 1 kHz to 100 MHz. The minimum value $P_{seedmin}$ is generally a sufficiently low power such that the seed signal 104 does not extract significant gain from the power amplifier 108 relative to the power extracted in the pulses. $P_{seedmin}$ may be zero. This condition can be stated mathematically as $$P_{seedmin} << DC * P_{seedmax}$$

Since the duty cycle is typically <0.01 pulses appear as spikes with a narrow width in FIG. 2. For clarity the separation between pulses in FIG. 2 is compressed.

Curve (b) represents the logarithm of the amplified output 109 of the power amplifier 108, which generally tracks the power of the seed signal 104. Amplified output 109 in the inter-pulse interval increases due to increasing unsaturated gain in the power amplifier.

Curve (c) depicts the unsaturated gain in the power amplifier where $G_{max}$ is the maximum value of unsaturated gain and $G_{min}$ is the minimum value of unsaturated gain. The value of unsaturated gain oscillates between $G_{max}$ and $G_{min}$. Emission of a pulse depletes the gain, the gain builds up in the interval between pulses. Gain increase comes from continuous, nominally constant, optical pumping of the power amplifier 108 during the period between the pulses. The values of $G_{max}$ and $G_{min}$ depend on the pump rate, the duty cycle and the amount of energy extracted in each pulse. Both $G_{max}$ and $G_{min}$ increase when the pump rate increases. However, $G_{max}$ and $G_{min}$ also both decrease when the duty cycle DC increases.

Operating the system 100 with a continuous pulse train has limited application. It is more desirable to control the output pulse train such that it can be selectively switched on and off. An external modulator may be used for this purpose but these devices are expensive and additional timing circuitry is required. The external modulator can be damaged by the high powers of the output pulse. A control system using existing components of the optical system 100 may be implemented to control the output pulse train. This method eliminates the cost of additional hardware, minimizes risk of optical damage to power amplifier 108 by inadvertent build-up of excessive gain, and allows a level of control which is difficult, if not impossible, to achieve with an external modulator.

Operating system 100 with an output of asynchronous flat top pulse bursts is a commonly used mode of operation. Many applications require pulse bursts (groups of one or more output optical pulses) having identical characteristics, but the time between them, $\tau_{dwell}$, is variable and asynchronously controlled in response to a user controlled input 123. All pulses in a flat top pulse burst have nominally equal pulse energies and peak powers. The period T between successive pulses within pulse burst is typically a constant. Delay between successive bursts is arbitrary, but otherwise all bursts are nominally identical. By way of example and not by way of limitation, in laser via drilling it is desirable if each pulse burst is nominally identical so that each via is identical. The time between successive via drilling operations is variable depending on the spacing of the vias and the time needed to position the laser beam relative to the substrate in which the vias are to be drilled.

However, it is difficult to achieve flat top pulse burst. Pulse characteristics depend on the gain in power amplifier 108 and this gain varies depending on pumping rate and energy extraction rate. For all the pulses to be equal, unsaturated gain in the power amplifier at the beginning of the pulse needs to equal to $G_{max}$ and each seed source pulse is nominally identical.

Figure 3:
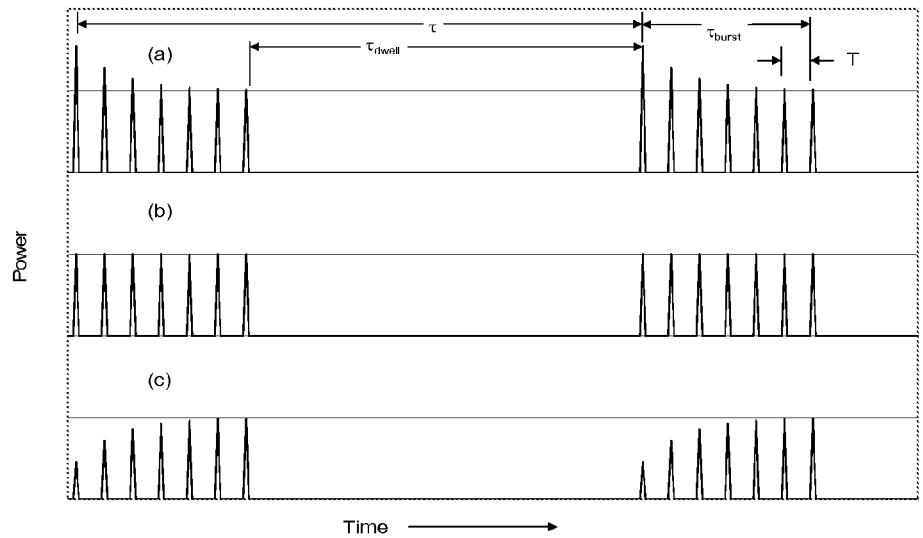
FIG. 3 is a timing diagram illustrating pulse bursts with excessive initial gain case, matched initial gain case and deficient initial gain case.

FIG. 3 shows three examples of pulse bursts. As shown in this figure, each pulse burst has seven pulses and the period between successive pulses within each burst is T. The total length of each pulse burst is denoted $\tau_{burst}$. The period between the start of successive pulse bursts is denoted $\tau$ and the time between the end of one pulse burst and the start of the next pulse burst is denoted $\tau_{dwell}$. While FIG. 3 shows seven (7) pulses in the burst this is only for the sake of example; the number of pulses in the burst is arbitrary. By way of example, in many practical applications pulses bursts may have any number of pulses ranging from a single pulse up to tens or hundreds of pulses per burst. There are three classifications of pulse bursts. First, in an excessive initial gain case, $G > G_{max}$, one or more initial pulses in the burst are larger than later pulses as shown by way of example in curve a) of FIG. 3. Second, in a matched initial gain case, $G = G_{max}$, the pulse is a flat topped pulse burst in which all the pulses are of equal height, e.g., as shown in curve b) of FIG. 3. Third, in a deficient initial gain case, $G < G_{max}$, one or more initial pulses in the burst are smaller than later pulses as shown, e.g., in curve c) of FIG. 3.

According to embodiments of the present invention, a flat top pulse burst of the type shown in the matched initial gain case shown in curve b) may be realized by control of seed source power level during the dwell time between pulse bursts. Specifically, during the time interval $\tau_{dwell}$ between successive pulse bursts the seed power of the seed signal 104 may be controlled to an intermediate value between the minimum seed power, $P_{seedmin}$, and the maximum seed power, $P_{seedmax}$. This intermediate value is denoted herein as the simmer power, $P_{simmer}$. The seed power of the seed signal 104 functionally extracts gain out of the power amplifier 108 so that it reaches a steady-state value of unsaturated gain corresponding to the $G_{max}$ of the pulse burst. During the interval $\tau_{dwell}$ between successive pulse bursts, the "simmer" seed power $P_{simmer}$ corresponds to a pulse rate equivalent power (PREP), which is sufficiently large that the seed signal 104 removes an amount of energy from the power amplifier 108 that is equivalent to the energy that would be extracted by a steady state train of pulses during $\tau_{dwell}$.

The intermediate value may be chosen to control a gain in the optical amplifier such that a pulse or pulse burst that follows the inter-pulse period exhibits a desired behavior. There are a number of different ways in which a pulse or pulse burst may exhibit desired behavior. For example, during the pulse or pulse burst it is desirable that gain does not build up in the optical amplifier 108 to the point that it destroys or causes failure in the optical amplifier 108 or other components of the system 100. Tailored pulses, e.g., a flat-topped burst of pulses, are often desirable. Uniform pulses within a burst are often desirable. Non-uniform but useful patterns of pulses within a burst may also be desirable. Producing a uniform single pulse on demand is also often desirable. Desirable behavior may be determined by the user in advance of operation of the system 100.

Figure 4:
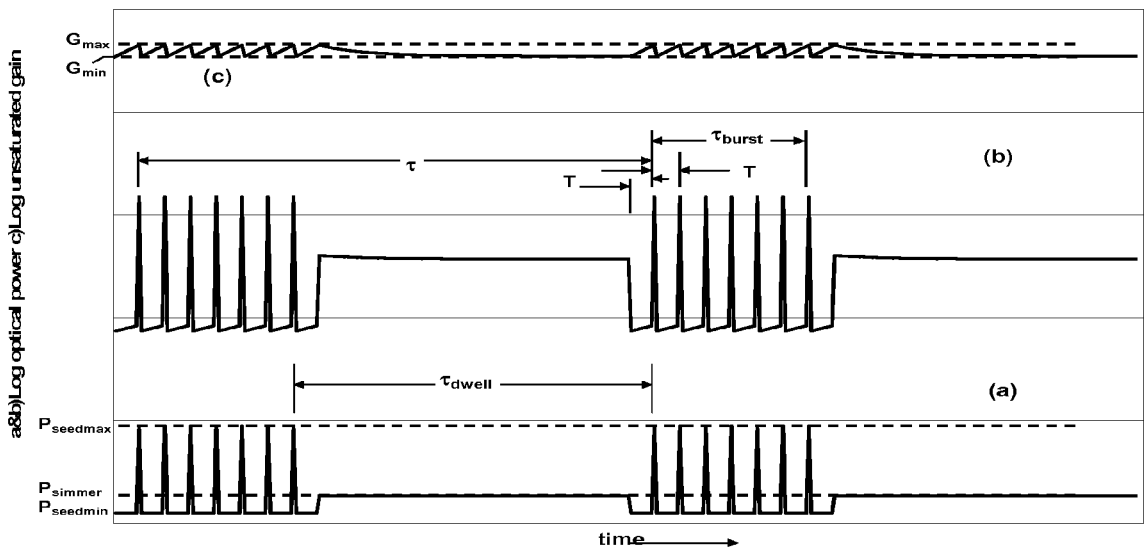
FIG. 4 is a timing diagram illustrating logarithm of seed source power, logarithm of power amplifier output, and logarithm of power amplifier unsaturated gain in a flat topped pulse burst.

FIG. 4 depicts an example of a method of operation of the seed source 102 to produce a flat topped pulse burst. FIG. 4 includes a curve a) showing the logarithm of seed source power, a curve b) showing the logarithm of power amplifier output, and a curve c) showing power amplifier unsaturated gain.

As seen in FIG. 4, a typical cycle may begin with the seed power at $P_{seedmin}$ as shown in curve a). After period T seed power increases to $P_{seedmax}$ to initiate a pulse. Seed power cycles between $P_{seedmin}$ and $P_{seedmax}$ during duration of a pulse burst, $\tau_{burst}$, and for a period T after the end of a pulse burst. During most of dwell period between pulse bursts, the seed source output power 104 is fixed at a value $P_{simmer}$. $P_{simmer}$ is selected such that for an arbitrarily long period between the pulse bursts, all pulse bursts will have matched initial gain, $G_{max}$, corresponding to the PREP condition. Resultant pulse bursts will all be nominally identical and all pulses within the burst will be nominally equal. The period between pulse bursts, $\tau_{dwell}$, is arbitrary and is asynchronously controlled by user controlled input 123 or feedback signal 120.

Curve (b) represents the logarithm of the amplified output 109 of the power amplifier 108. The amplified output generally tracks the seed power, with some small, variable output from ASE between the pulses. It is noted that the scale in curve (b) is logarithmic scale so differences in power levels are compressed.

Unsaturated gain in the power amplifier is depicted in curve (c). During most of the dwell time between pulse bursts the gain is held at the minimum gain level $G_{min}$. When a pulse burst cycle is initiated, the seed power is reduced and gain increases to $G_{max}$ after a time T at which time a pulse is initiated by increasing the seed power to $P_{seedmax}$.

In the example shown in FIG. 4 the flat-topped pulse bursts each have seven nominally identical pulses. As noted above, the number of pulses in the bursts is arbitrary and may be as little as only a single pulse in the burst. The pulse bursts may be asynchronously generated in response to user controlled input 123 or feedback signal 120. This mode of operation is known as "pulse-on-demand". While all pulses in a burst are nominally identical, in practice some degree of variation between pulses is inevitable. However, even with such variation, a pulse burst may be regarded as flat-topped if the degree of variation is acceptable for the purposes of the intended application. For practicable applications a burst for which the standard deviation in either pulse energy or the pulse amplitude (equivalent to peak power) for pulses within the burst is less than 10% may be regarded as a flat topped pulse burst.

In the example depicted in FIG. 4 the power of the seed signal 104 drops to the minimum value $P_{seedmin}$ prior to the start of the pulse burst for a time T and stays at the minimum value $P_{seedmin}$ after the last pulse in the burst for a time T. This particular form of seed power control is not strictly necessary for a flat topped pulse burst, but it can be convenient for other aspects of system control and implementation. For example this form of seed power control allows the background level adjacent to all pulses in the burst to be equal, it also allows the pulse burst to be triggered with a delay of T relative to a control signal effectively suppressing the first pulse in a triggered sequence. In addition, maintaining the seed power at the minimum value $P_{seedmin}$ for a time T after the burst minimizes the recovery time necessary between pulse bursts since the gain rapidly recovers to its maximum value.

However, different algorithms for controlling the seed power between the pulse bursts may be used with the same result of generating flat topped pulse bursts. As long as the algorithm satisfies the PREP condition it can produce a flat topped pulse burst. An important point is that the unsaturated gain in the power amplifier at the beginning of the first pulse in the burst must be equal to the maximum gain $G_{max}$. The seed signal 104 may be modulated to provide a series of ramps, pulses, or arbitrary waveforms, in the dwell time between pulse bursts, so long as the unsaturated gain in the power amplifier 108 equals $G_{max}$ at the beginning of the pulse burst. The waveform of the seed signal 104 between pulse bursts may be chosen for convenience based on factors such as minimizing delay between a control signal and the beginning of the pulse burst, minimizing recovery time between successive pulse bursts, and ease of implementation of the control algorithm.

Figure 5:
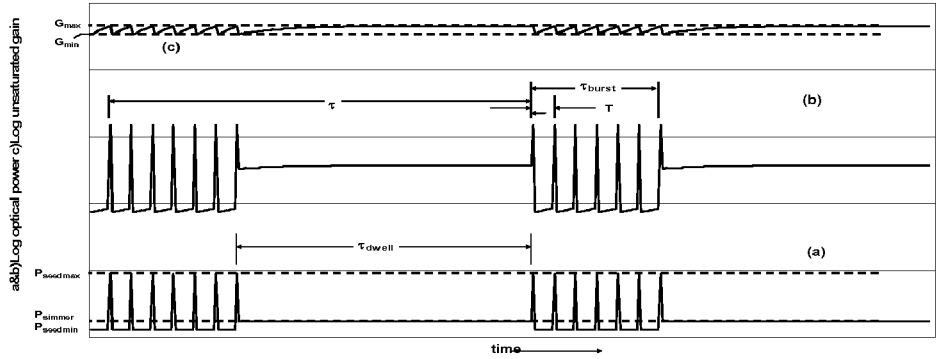
FIG. 5 is a timing diagram showing logarithm of seed source power, logarithm of power amplifier output, and logarithm of power amplifier unsaturated gain with a constant value of seed source power during the dwell period between pulse bursts in a flat topped pulse burst.

FIG. 5 shows an alternative example of a different seed source output power 104 waveform during the dwell period, $\tau_{dwell}$. Unlike the waveform in FIG. 4 the seed source output power 104 does not return to $P_{seedmin}$ after the last pulse in the pulse burst. Instead the seed source power goes to a value $P_{simmer}$ and stays at this value until the beginning of the next pulse burst. Note that the value of $P_{simmer}$ in FIG. 5 is lower than the value of $P_{simmer}$ in FIG. 4. An advantage of this type of dwell period waveform is that a pulse burst may be initiated immediately upon a system controller 101 receiving a user control input 123 or any other signal that would trigger the start of a pulse burst. A delay time of period T is not necessary as it is in the case shown in FIG. 4 since the power amplifier is already at its proper value of unsaturated gain, $G_{max}$.

Figure 6:
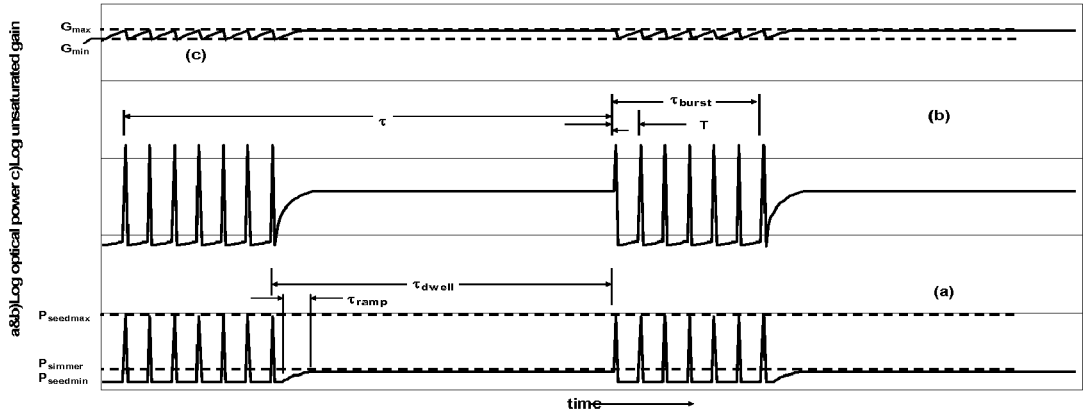
FIG. 6 is a timing diagram showing logarithm of seed source power, logarithm of power amplifier output, and logarithm of power amplifier unsaturated gain with a ramp and then constant value of seed source power during dwell period between pulse bursts for a flat topped pulse burst.

FIG. 6 shows an additional alternative example of a different waveform representing the power of the seed signal 104 during the dwell period, $\tau_{dwell}$. Unlike the waveform in FIG. 5 the seed source output power 104 is not constant through the entire dwell period. After the conclusion of the last pulse in one burst the power of the seed signal 104 returns to the minimum value $P_{seedmin}$. The seed source power then ramps to a constant value $P_{simmer}$ over a time interval denoted $\tau_{ramp}$. In this case the value of $P_{simmer}$ in FIG. 6 is identical to the value of $P_{simmer}$ in FIG. 5. As in the control algorithm depicted in FIG. 5 an advantage of this type of dwell period waveform is that a pulse burst may be initiated immediately upon a system controller 101 receiving a user control input 123 or any other signal that would trigger the start of a pulse burst. It may be easier in practice to determine the optimum value for $P_{simmer}$ using a ramp on the seed source power rather than a step function type change as depicted in FIG. 5.

A tailored pulse burst is a generalization of the concept of a pulse burst to a pulse burst where not all pulses are equal, but instead are controllable in a user definable manner. This may be implemented, e.g., by controlling the power of the seed signal 104 during the periods between pulses within a pulse burst. The resulting tailored pulse burst may have many possible burst waveforms such as higher energy pulses at front of pulse burst, higher energy pulses at end of the pulse burst, or pulses in the burst can be missing. The pulse repetition rate need not be constant over the entire duration of the burst and the period between different pulses may be different. The individual pulse width, pulse energy, and pulse peak power may be different between each pulse in the burst. Similarly the period between the pulses or pulse spacing may differ within the pulse.

Furthermore, all pulse bursts within a series of pulse bursts need not have the same waveform. Some pulse bursts in the series may be flat topped and other pulse bursts in the series may be tailored. Generation of tailored pulse bursts may be achieved by an extension of the previously discussed ideas. Generation of flat topped pulse bursts may be achieved by controlling the seed source output power 104 during the dwell time between pulse bursts. In analogous manner control over the individual pulses within a pulse burst may be achieve by controlling the power of the seed signal 104 between the individual pulses in a pulse burst.

Figure 7:
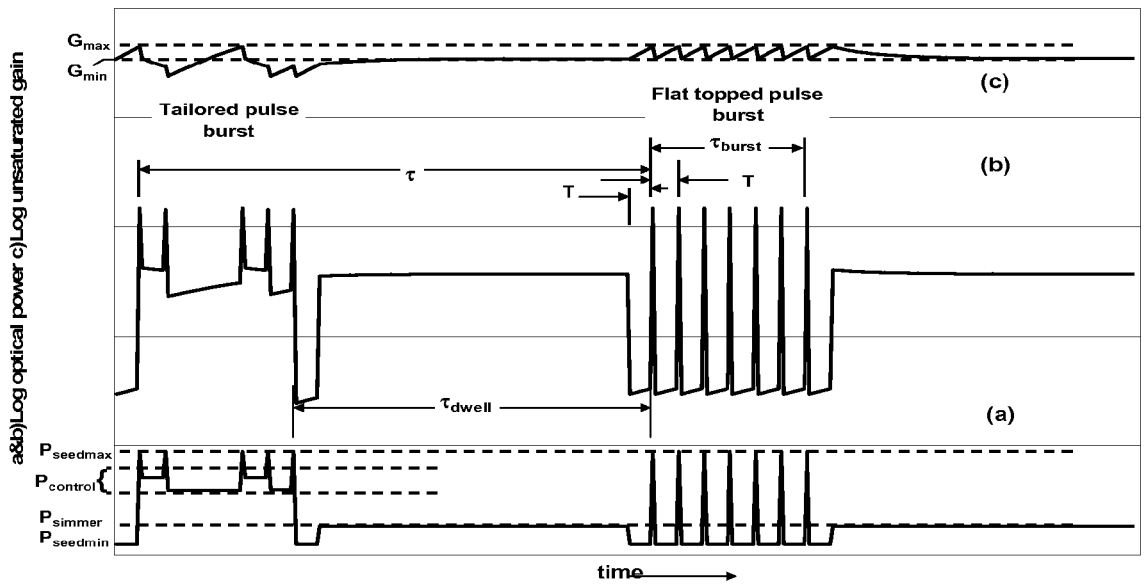
FIG. 7 is a timing diagram of a series of pulse bursts showing first a tailored pulse burst followed by a flat topped pulse burst showing logarithm of seed source power, logarithm of power amplifier output, and logarithm of power amplifier unsaturated gain.

An example of a pulse train having two different pulse bursts is shown in FIG. 7. Three different curves are depicted in FIG. 7 including a curve a) showing logarithm of seed source power, a curve b) showing logarithm of power amplifier output and a curve c) showing the logarithm of the power amplifier unsaturated gain.

The series of pulse bursts depicted in FIG. 7 includes a first tailored pulse burst, where not all the pulses in the burst are equal in amplitude, followed by a second flat topped pulse burst, where all pulses in the burst are nominally equal in amplitude. The number of pulses in the burst and details of the pulse burst waveform are presented for the sake of example only and should not be considered as limiting the scope of the invention. The first tailored pulse burst contains five pulses. The first pulse is identical to the pulses in the flat-topped second burst. Between the first and second pulses, the power of the seed signal 104 is held at an intermediate power level, $P_{control}$, between $P_{seedmin}$ and $P_{seedmax}$. The power level is set according to a desired pulse energy of a subsequent pulse. The pulse energy may be reduced by increasing the value of $P_{control}$ farther above the minimum value, $P_{seedmin}$. The second pulse is emitted when the power of the seed signal 104 is increased to $P_{seedmax}$. Note that seed pulse may be identical for all pulses. However, the power of the second pulse is reduced, since the level of unsaturated gain in the power amplifier 108 is below $G_{max}$. Due to the logarithmic scale, the decrease in power of the second pulse may not be readily apparent in FIG. 7. After emitting the second pulse, the seed power may be operated at a different level of $P_{control}$. This level is chosen so that third pulse in the burst is similar to first pulse. The time duration between the second and third emitted pulse is also longer than time duration between first and second pulse, which demonstrates the ability to change the pulse repetition rate within the pulse burst. In the example illustrated in FIG. 7 the duration between pulses is increased by suppressing some pulses in the pulse burst.

The third pulse is emitted when the seed power is increased to the maximum value $P_{seedmax}$. Between the third and forth pulses the seed source 102 may be operated at a power level $P_{control}$ similar to that previously used between first and second pulse. The fourth pulse is emitted when the seed power is increased to $P_{seedmax}$. The resultant fourth pulse may therefore have similar characteristics to the second pulse. Between the fourth and fifth pulses the seed source 102 may be operated at a different control power level. The resultant fifth output pulse may therefore be similar to the fourth output pulse.

Figure 8:
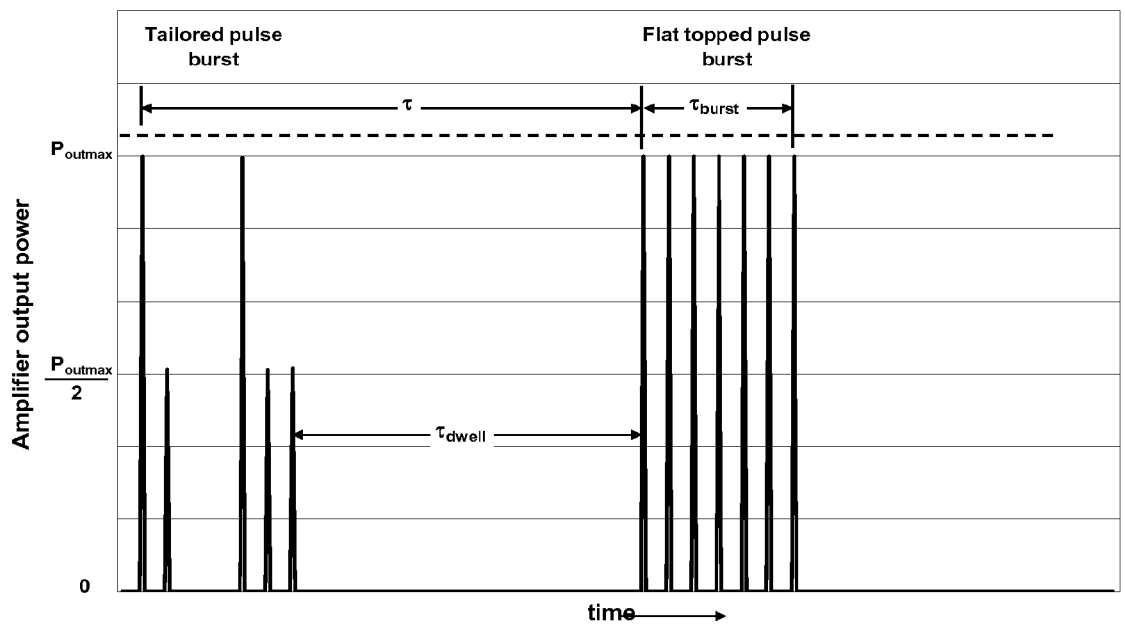
FIG. 8 is a timing diagram of a series of pulse bursts showing the power amplifier output for a tailored pulse burst followed by a flat topped pulse burst, linear vertical scale.

Pulse characteristics of the amplified output 109 corresponding to the pulses depicted in FIG. 7 may be more clearly understood by referring to FIG. 8. The amplified output 109 versus time is shown on a linear vertical scale in FIG. 8, which corresponds to the same pulse burst depicted on logarithmic vertical scale in curve (b) of FIG. 7. FIG. 8 also shows a tailored pulse having first and third pulses with a maximum power $P_{outmax}$ and second, fourth, and fifth pulses have a maximum power $P_{outmax}/2$. In this example, the duration between the first and second pulses, between the third and fourth pulses, and between the fourth and fifth pulses is T. The duration between the second and third pulse is longer, in this case three times as long as the pulse period, T, between the other pulses in the pulse burst.

Similar to the control algorithms described for the dwell time in the case of a flat topped pulse burst, different algorithms for controlling the seed power between the pulses within a burst may be used to generate a tailored pulse burst. An important point is that the unsaturated gain in the power amplifier 108 at the beginning of a pulse in the burst is equal to its desired value. Seed power of the seed signal 104 may include a series of ramps, pulses, or arbitrary waveforms, so long as the unsaturated gain in power amplifier 108 equals the desired value at the beginning of the pulse. The waveform of seed signal 104 between pulses may be chosen for convenience based on factors such as minimizing delay between control signal pulse, minimizing recovery time between adjacent pulses in the burst and easily implemented control algorithm.

For either a flat topped pulse burst or a tailored pulse burst the output of the power amplifier 108 may be wavelength converted in the wavelength converter 110. The wavelength conversion process efficiency is typically dependent on the peak power, which is described in U.S. Pat. No. 7,529,281, which is incorporated herein by reference. In many cases the conversion efficiency increases linearly or as the square of the peak power over a wide range of peak powers, for example in second harmonic generation the conversion efficiency increases linearly over a wide range of peak powers and in third harmonic generation the conversion efficiency increases as the square over a wide range of peak powers.

The efficiency dependence of the harmonic conversion process on peak power increases the on/off contrast ratio of the wavelength-converted output 111 compared to the fundamental amplified output 109, which allows control and adjustment of the average wavelength converted power while maintaining a nominally constant average output power from the power amplifier and a nominally constant pump power.

Figure 9:
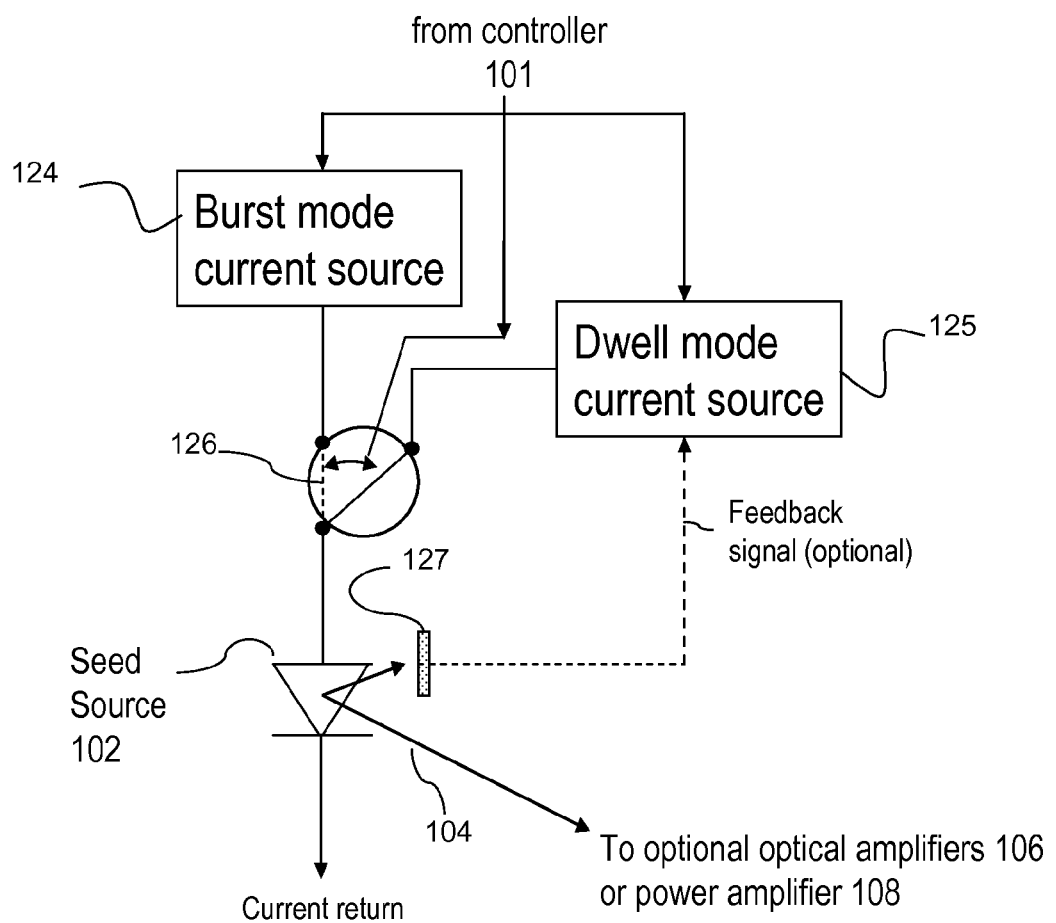
FIG. 9 is a schematic diagram of an electronic control system for generating pulse bursts according to a preferred embodiment of the present invention.

A schematic diagram of an electronic control system suitable to produce pulse bursts in accordance with a preferred embodiment of the present invention is shown in FIG. 9. As shown in FIG. 9, the power or amplitude of the seed signal 104 is controlled by two control circuits configured to control the seed signal 104 from the seed source 102. The control circuits include a burst mode control circuit 124 used in generating one or more pulses in a pulse burst and a dwell mode control circuit 125. The control circuits 124, 125 provide drive signals, e.g., energy in the form of an electrical current or voltage, that are tailored to drive the seed source 102 in a particular one of two different modes. By way of example, and not by way of limitation, the seed source 102 may be some type of semiconductor laser seed source as previously described. In such a case, the control circuits 124, 125 may be configured to control the amplitude or power of the seed signal 104 by controlling a drive current applied to the seed source 102. Alternatively, if an external modulator is used to control the power of the seed signal 104 the control circuits may include voltage sources that can be selectively coupled to the modulator.

A fast electronic switch 126 allows rapid switching between these two control circuits 124, 125. For example, if the seed source 102 is a semiconductor laser, the seed source 102 emits the seed signal 104 proportional to an applied drive current. Some of emitted seed signal 104 may be directed to the optical power amplifier 108, where it is amplified. Some of emitted light may be optionally directed to a monitor sensor 127 (e.g., a photodiode), which may provide a feedback signal to the burst mode control circuit 124 and/or the dwell mode control circuit 125. The two control circuits 124, 125 and fast electronic switch 126 are controlled by the system controller 101, which may provide operating parameters such as a signal to initiate a pulse burst, the duration and pulse repetition rate in the pulse burst, waveform of the tailored pulse burst, and the pump power level. Alternatively, other system operating parameters may be provided by the controller 101.

The electronic switching needs to be significantly faster than the dwell time between pulses so as not to introduce errors in pulse amplitude due to undesired contribution to optical output from the dwell mode. The switching time should be less than 1% of dwell time.

As shown in FIG. 9, the controller 101 indicates that a pulse burst should be initiated. The fast electronic switch 126 changes the seed source 102 from the dwell mode 125 to the burst mode current source 124. The burst mode current source 124 drives the seed source 102 in a pulsed manner generating a series of pulses as directed by the controller 101. A pulse burst may be flat topped if the power of the seed signal 104 is maintained at a nominally constant value between the pulses in the burst. Alternatively, the pulse burst may be tailored if the power of the seed signal 104 is varied between the pulses. When the requisite number of pulses has been generated, the controller 101 directs the fast electronic switch 126 to switch from the burst mode control circuit 124 back to the dwell mode control circuit 125. The seed source 102 may then be driven by the dwell mode control circuit 125 until the next pulse burst is initiated by the controller 101. The power of the seed signal 104 may be controlled using the optional monitor photodiode and feedback loop.

The feedback loop controls the dwell mode current source 125 by comparing the input from the photo monitor 127 with the input from the controller 101. The difference between the two inputs is amplified and applied to the seed source 102 when selected by the switch 126. The seed source responds so as to make the inputs equal thereby closing the feedback loop.

There are several possible applications of a tailored pulse burst such as in via drilling. For example it may be desirable to remove large amounts of material with the initial pulses in a pulse burst. Consequently it is desirable for the pulse burst to begin with one or more high power and high pulse energy pulses. In some situations, a via may terminate at a conductor and it is not desirable to drill through or damage the conductor surface. Consequently, near the end of pulse burst lower power and lower energy pulses may be used which are sufficient to slowly remove overlying material without damaging the underlying conductor.

Another application of a tailored pulse burst is in cutting or scribing substrates. In order to produce a uniform cut or scribe adjacent pulses should strike the substrate at a uniform spacing. When the relative motion between the optical system and substrate is constant, this implies that the system should be operating at a constant pulse repetition frequency. However, often the substrate is accelerating or decelerating relative to the optical system and as such the pulse frequency within the tailored pulse burst must incrementally vary to match the substrate velocity and produce uniformly spaced pulses. Preferably the pulse frequency, and hence the inter-pulse period, can be varied in increments of a fundamental period or fractions thereof The fundamental period may be a clock cycle for a clock that is part of the controller 101.

In an alternative embodiment, the power of the seed signal 104 may be adjusted during the pulse burst on a pulse-to-pulse basis. Such a mode of operation provides an additional level of control and may be useful if saturation of power amplifiers 108 and/or pre-amplifiers 106 is undesirable. Furthermore, the pulse width need not be constant for all pulses in pulse burst. The burst mode control circuit 124 may control the seed source 102 or external modulator so that the seed signal 104 has different pulse widths. In addition, individual pulses in the pulse burst can be tailored.

Embodiments of the present invention eliminate the need for cumbersome and expensive equipment that can accommodate high output powers and allow an unprecedented level of control in material processing applications. In the context of laser drilling and machining applications, this allows more energy efficient material removal and improves processing speed and throughput.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An optical system, comprising:
a seed source;
an optical amplifier coupled to the seed source;
a controller including logic adapted to generate a first control signal configured to vary a power of a seed signal from the seed source between a minimum value and a maximum value in a way that the seed signal exhibits one or more pulse bursts, wherein each pulse burst contains one or more pulses, wherein the logic is further configured to generate a second control signal configured to adjust the power of the seed signal to an intermediate value that is greater than the minimum value and less than the maximum value during an inter-pulse period between successive pulses within a pulse burst or between successive pulse bursts, wherein the intermediate value is chosen to control a gain in the optical amplifier such that a pulse or pulse burst that follows the inter-pulse period exhibits a desired behavior.

2. The system of claim 1 wherein the desired behavior is a flat-topped pulse burst.

3. The system of claim 1 wherein the desired behavior is a pulse burst having one or more pulses with a desired pattern of pulse heights, pulse widths and/or pulse spacings.

4. The system of claim 1, further comprising, a burst mode control circuit coupled to the controller, a dwell mode control circuit coupled to the controller and a switch, wherein the switch is coupled to the controller, wherein the switch is coupled to the burst mode control circuit, wherein the switch is coupled to the dwell mode control circuit, and wherein the switch is coupled to the seed source, wherein the switch is configured to selectively couple the first control signal from the burst mode control circuit or the second control signal from the dwell mode control circuit to the seed source in response to a mode selection signal from the controller.

5. The system of claim 4 wherein the seed source includes a laser diode and wherein the first and second control signals are configured to adjust a drive current applied to the laser diode.

6. The system of claim 4, further comprising a seed signal sensor configured to detect the seed signal from the seed source and produce a feedback signal proportional to the seed signal, wherein the seed source is coupled to the burst mode controller or the dwell mode controller, wherein the burst mode controller is configured to adjust the first control signal in response to the feedback signal, or wherein the dwell mode controller is configured to adjust the second control signal in response to the feedback signal.

7. The system of claim 1 wherein the seed source includes a laser diode.

8. The system of claim 7 wherein the first and second control signals are configured to adjust a drive current applied to the laser diode.

9. The system of claim 1, wherein the seed source includes an optical modulator or wherein an external optical modulator is coupled between the seed source and the optical amplifier.

10. The system of claim 9 wherein the first and second control signals are configured to adjust an optical transmission of the optical modulator or the external optical modulator.

11. The system of claim 1, further comprising a wavelength converter optically coupled to an output of the optical amplifier.

12. The system of claim 1 wherein the optical amplifier is a fiber amplifier.

13. A method for controlling output pulses from an optical system having a seed source and an optical amplifier coupled to the seed source, the method comprising:

a) generating a first control signal configured to vary a power of a seed signal from the seed source between a minimum value and a maximum value in a way that the seed signal exhibits one or more pulse bursts, wherein each pulse burst contains one or more pulses; and b) generating a second control signal configured to adjust the power of the seed signal to an intermediate value that is greater than the minimum value and less than the maximum value during an inter-pulse period between successive pulses within a pulse burst or between successive pulse bursts, wherein the intermediate value is chosen to control a gain in the optical amplifier such that a pulse or pulse burst that follows the inter-pulse period exhibits a desired behavior.

14. The method of claim 13 wherein the desired behavior is a flat-topped pulse burst.

15. The method of claim 13 wherein the desired behavior is a pulse burst having one or more pulses with a predetermined pattern of pulse heights, pulse width, and/or pulse spacings.

16. The method of claim 13, wherein a) includes generating the first control signal with a burst mode control circuit, wherein b) includes generating the second control signal with a dwell mode control circuit, the method further comprising selectively coupling the burst mode control circuit or the dwell mode control circuit to the seed source.

17. The method of claim 16 wherein the seed source includes a laser diode and wherein the first and second control signals are configured to adjust a drive current applied to the laser diode.

18. The method of claim 16, further comprising producing a feedback signal proportional to the seed signal, and using the burst mode controller to adjust the first control signal in response to the feedback signal, or using the dwell mode controller to adjust the second control signal in response to the feedback signal.

19. The method of claim 13 wherein the seed source includes an optical modulator or wherein an external optical modulator is coupled between the seed source and the optical amplifier and the first and second control signals are configured to adjust an optical transmission of the optical modulator or the external optical modulator.

20. The method of claim 13, further comprising, pumping the optical amplifier at a nominally constant pump rate.

21. An optical system, comprising:
a seed source;
an optical amplifier coupled to the seed source;
a controller operably coupled to the seed source, the controller including logic adapted to cause the seed source to generate one or more pulse bursts, wherein a period between pulses within a given pulse burst is incrementally variable.

22. The system of claim 21, wherein the pulse burst is a flat-topped pulse burst.

23. The system of claim 22, wherein the controller is configured to adjust the period between pulses such that a spacing between pulses striking a moving target is nominally constant.

* * * * *